(12) United States Patent
Bain et al.

(10) Patent No.: US 9,691,985 B2
(45) Date of Patent: Jun. 27, 2017

(54) PASSIVATION LAYERS FOR ORGANIC ELECTRONIC DEVICES INCLUDING POLYCYCLOOLEFINIC POLYMERS ALLOWING FOR A FLEXIBLE MATERIAL DESIGN

(71) Applicant: Merck Patent GmbH, Darmstadt (DE)

(72) Inventors: Stephen Bain, Southampton (GB); Irina Afonina, Southampton (GB); Tomas Backlund, Southampton (GB); Paul Craig Brookes, Acton, MA (US)

(73) Assignee: Merck Patent GmbH, Darmstadt (DE)

( * ) Notice: Subject to any disclaimer, the term of this patent is extended or adjusted under 35 U.S.C. 154(b) by 19 days.

(21) Appl. No.: 14/433,083

(22) PCT Filed: Aug. 22, 2013

(86) PCT No.: PCT/EP2013/002536
§ 371 (c)(1),
(2) Date: Apr. 2, 2015

(87) PCT Pub. No.: WO2014/053202
PCT Pub. Date: Apr. 10, 2014

(65) Prior Publication Data
US 2015/0280128 A1     Oct. 1, 2015

(30) Foreign Application Priority Data
Oct. 4, 2012  (EP) ..................................... 12006871

(51) Int. Cl.
*H01L 51/00*     (2006.01)
*H01L 51/10*     (2006.01)
(Continued)

(52) U.S. Cl.
CPC ........ *H01L 51/004* (2013.01); *H01L 51/0035* (2013.01); *H01L 51/0043* (2013.01); *H01L 51/107* (2013.01); *C08F 230/08* (2013.01); *C08L 45/00* (2013.01); *C08L 79/085* (2013.01); *H01L 51/0014* (2013.01);
(Continued)

(58) Field of Classification Search
None
See application file for complete search history.

(56) References Cited

U.S. PATENT DOCUMENTS

| 7,475,444 B2 | 1/2009 | Yim et al. |
| 2006/0010614 A1 | 1/2006 | Yim et al. |

(Continued)

FOREIGN PATENT DOCUMENTS

| WO | 2006009380 A2 | 1/2006 |
| WO | 2011026550 A1 | 3/2011 |

OTHER PUBLICATIONS

International Search Report from PCT Application No. PCT/EP2013/002536 dated Feb. 26, 2014.

*Primary Examiner* — Michael Jung
*Assistant Examiner* — Jay C Chang
(74) *Attorney, Agent, or Firm* — Millen White Zelano and Branigan, PC; John Sopp; Anthony Zelano

(57) ABSTRACT

The invention generally relates to passivation layers for use in organic electronic devices, and more specifically in organic field effect transistors, to processes for preparing such passivation layers, and to organic electronic devices and organic field effect transistors encompassing such passivation layers.

22 Claims, 3 Drawing Sheets

(51) Int. Cl.
    *C08F 230/08*     (2006.01)
    *C08L 79/08*      (2006.01)
    *C08L 45/00*      (2006.01)
    *H01L 51/05*      (2006.01)
(52) U.S. Cl.
    CPC ...... *H01L 51/0541* (2013.01); *H01L 51/0545* (2013.01); *H01L 2251/558* (2013.01)

(56) References Cited

U.S. PATENT DOCUMENTS

| | | |
|---|---|---|
| 2012/0056249 A1 | 3/2012 | Mueller et al. |
| 2012/0153285 A1* | 6/2012 | James ............... H01L 51/107 257/57 |

* cited by examiner

PASSIVATION LAYERS FOR ORGANIC ELECTRONIC DEVICES INCLUDING POLYCYCLOOLEFINIC POLYMERS ALLOWING FOR A FLEXIBLE MATERIAL DESIGN

TECHNICAL FIELD

The invention generally relates to passivation layers for use in organic electronic devices, and more specifically in organic field effect transistors, to processes for preparing such passivation layers, and to organic electronic devices and organic field effect transistors encompassing such passivation layers.

BACKGROUND

In recent years there has been growing interest in organic electronic (OE) devices, for example organic field effect transistors (OFET) for use in backplanes of display devices or logic capable circuits, and organic photovoltaic (OPV) devices. A conventional bottom gate OFET comprises a gate electrode, a gate insulator layer made of a dielectric material (also referred to as "dielectric" or "gate dielectric"), source and drain electrodes, a semiconducting layer made of an organic semiconductor (OSC) material, and typically a passivation layer on top of the OSC layer to protect it against environmental influence and/or damage from subsequent device manufacturing steps.

For OFET devices in particular solution processable passivation layers are desired. The key requirements for materials used in such passivation layers are orthogonality of the passivation layer solvent with the OSC layer, and adhesion to the underlying layers. The passivation materials should be solution based and should be suitable for solution based deposition methods like spin-coating, or wider area printing methods including flexo, gravure and slot-die coating.

One aim of the present invention is to provide passivation layers and materials used therein which meet these requirements. Another aim is to provide improved methods of manufacturing such passivation layers. Another aim is to provide improved OE devices, in particular OFETs, more specifically bottom gate OFETs, comprising such passivation layers. Further aims are immediately evident to the person skilled in the art from the following description.

The inventors have found these aims can be achieved by providing passivation layers for use in OFET devices, methods of manufacturing such passivation layers, and passivation materials comprised therein, in accordance with the present invention and as claimed hereinafter. In particular, it was found that the above aims could be achieved by using a three layer passivation stack, comprising

- a bottom layer that is deposited on the OSC layer and contains a material having good adhesion to the OSC layer and being processable from solvents that are orthogonal to the OSC layer,
- a top layer that provides good resistance to subsequent device manufacturing steps, and
- an intermediate layer that is provided between the bottom layer and the top layer and provides good adhesion between the bottom and the top layer, and preferably also good solvent resistance to prevent that the bottom layer swells in the solvent used for the top layer.

Such a passivation layer stack was found to provide adequate adhesion to the OSC and between the individual passivation layers, to provide a top surface that is resistant to subsequent device manufacturing steps, especially to metal deposition and etching processes, and to be especially suitable for mass production of OFET devices. The bottom layer of the passivation layer stack can also be deposited onto a patterned OSC layer which is provided on an organic gate dielectric layer, so that the adhesion of the bottom layer to both the OSC and the underlying organic gate dielectric should be strong.

SUMMARY

The invention relates an organic electronic device comprising an organic semiconductor (OSC) layer and a passivation layer stack provided on the OSC layer, characterized in that the passivation layer stack comprises

- a first layer that is deposited on the OSC layer and comprises a polycycloolefinic polymer comprising pendant fluorinated groups, and
- a second layer that is deposited on the first layer and comprises a fluoropolymer, and
- a third layer that is deposited on the second layer and comprises a polycycloolefinic polymer comprising pendant fluorinated groups and pendant crosslinkable groups.

The organic electronic device is for example an Organic Field Effect Transistor (OFET), including Organic Thin Film Transistors (OTFT), an Organic Light Emitting Diode (OLED), an Organic Photovoltaic (OPV) device or an Organic Photodetector (OPD), especially a top gate OFET or bottom gate OFET, preferably a bottom gate OFET.

The invention further relates to a product or an assembly comprising an organic electronic device as described above and below. Such product or assembly is preferably an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a sensor, a biosensor or a biochip.

The invention further relates to a process of preparing a passivation layer stack as described hereinafter.

The invention further relates to a process of preparing an organic electronic device, especially a top gate OFET or bottom gate OFET, comprising a passivation layer stack as described hereinafter.

BRIEF DESCRIPTION OF THE DRAWINGS

Embodiments of the invention are described below with reference to the following drawings.

DETAILED DESCRIPTION

Figure 1:
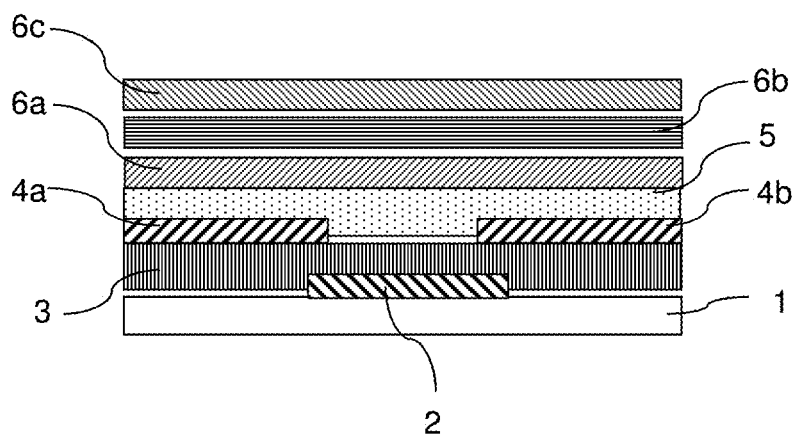
FIG. 1—is a schematic representation of a bottom gate OFET device in accordance with the present invention.

As used herein, the term Organic Field Effect Transistors (OFET) will be understood to be inclusive of the subclass of such devices known as Organic Thin Film Transistors (OTFTs).

In addition, it will be understood that the terms "dielectric" and "insulating" are used interchangeably herein. Thus reference to an insulating material or layer is inclusive of a dielectric material or layer. Further, as used herein, the term "organic electronic device" will be understood to be inclusive of the term "organic semiconductor device" and the several specific implementations of such devices such as the OFETs as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

(A1)

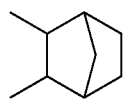

(A2)

However, the term "norbornene-type monomer" or " norbornene-type repeating unit", as used herein, is understood to not only mean norbornene itself but also to refer to any substituted norbornene, or substituted and unsubstituted higher cyclic derivatives thereof, for example of Structures B1 and B2, shown below, wherein m is an integer greater than zero.

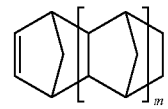

(B1)

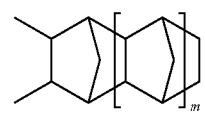

(B2)

By the substitution of a norbornene-type monomer with a pendant group, the properties of a polymer formed therefrom can be tailored to fulfill the needs of individual applications. The procedures and methods that have been developed to polymerize functionalized norbornene-type monomers exhibit an outstanding flexibility and tolerance to various moieties and groups of the monomers. In addition to polymerization of monomers with a specific pendant group, monomers having a variety of distinct functionalities can be randomly polymerized to form a final material where the types and ratios of monomers used dictate the overall bulk properties of the resulting polymer.

The repeating units in the norbornene-type polymers in accordance with the present invention, like unit A2 or B2, are typically formed from the norbornene-type monomers, like monomer A1 or B1, by an addition type polymerization method, but not by a ring opening metathesis type polymerization (ROMP) method which is also disclosed in prior art for norbornenes.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, phenethyl and phenbutyl.

The term "halohydrocarbyl" as used herein is inclusive of the hydrocarbyl moieties mentioned above but where there is a degree of halogenations, preferably fluorination, that can range from at least one hydrogen atom being replaced by a halogen atom, preferably a fluoro atom, (e.g. a fluoromethyl group) to where all hydrogen atoms on the hydrocarbyl group have been replaced by a halogen atom, preferably a fluoro atom, (e.g. trifluoromethyl or perfluoromethyl), also referred to as perhalogenation or perfluoration. For example, halogenated alkyl groups that can be useful in embodiments of the present invention can be partially or fully halogenated, alkyl groups of the formula $C_aX_{2a+1}$ wherein X is independently a halogen or a hydrogen and a is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbons atoms is replaced by a heteroatom selected independently from O, S, N, P, or Si. Such heteroatom containing moieties can be referred to as, for example, either "heteroatom-hydrocarbyls" or "heterohydrocarbyls", including, among others, ethers, thioethers, epoxies, glycidyl ethers, alcohols, thiols, carboxylic acids, esters, thioesters, maleimides, amines, imines, amides, phenols, amido-phenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, $-(CH_2)_n-Ar-(CH_2)_n-C(CF_3)_2-OH$, $-(CH_2)_n-Ar-(CH_2)_n-OCH_2C(CF_3)_2-OH$, $-(CH_2)_n-C(CF_3)_2-OH$, $-((CH_2)_i-O-)_k-(CH_2)-C(CF_3)_2-OH$, $-(CH_2)_n-C(CF_3)(CH_3)-OH$, $-(CH_2)_n-C(O)NHR^*$, $-(CH_2)_n-C(O)Cl$, $-(CH_2)_n-C(O)OR^*$, $-(CH_2)_n-OR^*$, $-(CH_2)_n-OC(O)R^*$ and $-(CH_2)_n-C(O)R^*$, where n independently represents an integer from 0 to 12, i is 2, 3 or 4, k is 1, 2 or 3, Ar is aryl, for example phenyl, and $R^*$ independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perfluorinated alkyl groups include, but are not limited to, trifluoromethyl, $-C_2F_5$, $-C_3F_7$, $-C_4F_9$, $-C_6F_{13}-$, $-C_7F_{15}$, and $-C_{11}F_{23}$. Exemplary fluorinated or perfluorinated aryl and aralkyl groups include, but are not limited to, groups having the formula $-(CH_2)_x-C_6F_yH_{5-y}$, and $-(CH_2)_x-C_6F_yH_{4-y}-pC_zF_qH_{2z+1-q}$, where x, y, q and z are independently selected integers from 0 to 5, 0 to 5, 0 to 9 and 1 to 4, respectively. Specifically, such exemplary fluorinated or perfluorinated aryl groups include, but are not limited to, pentafluorophenyl, pentafluorobenzyl, 4-trifluoromethylbenzyl, pentafluorophenethyl, pentafluorophenpropyl, and pentafluorophenbutyl.

The polycycloolefinic polymer comprised in the first and the third passivation layer is preferably a norbornene-type polymer.

In a preferred embodiment of the present invention, the norbornene-type polymer incorporates two or more distinct types of repeating units.

In another preferred embodiment the norbornene-type polymer comprises one or more distinct types of repeating units of Formula I

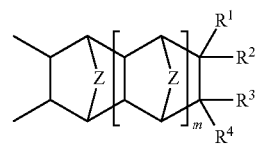

wherein Z is selected from $-CH_2-$, $-CH_2-CH_2-$ or $-O-$, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

The repeating units of Formula I are formed from the corresponding norbornene-type monomers of Formula Ia where Z, m and $R^{1-4}$ are as defined above:

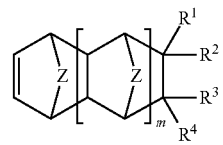

In the repeating units and monomers of Formula I and Ia, in a preferred embodiment Z is $-CH_2-$ and m is 0, 1 or 2, in another preferred embodiment, Z is $-CH_2-$ and m is 0 or 1, and in still another preferred embodiment, Z is $-CH_2-$ and m is 0.

In another preferred embodiment the first and/or third passivation layer comprises a polymer composition which comprises a either a single norbornene-type polymer or a blend of two or more different norbornene-type polymers. Where such polymer composition embodiments encompass a single norbornene-type polymer, such polymer can be a homopolymer, that is to say a polymer encompassing only one type of repeating unit, or a copolymer, that is to say a polymer encompassing two or more distinct types of repeating units. Where such polymer composition embodiments encompass a blend of different polymers, "different" is understood to mean that each of the blended polymers encompasses at least one type of repeating unit, or combination of repeating units, that is distinct from any of the other blended polymers.

In another preferred embodiment of the invention the polymer composition is a blend of two or more different norbornene-type polymers, wherein each polymer comprises one or more distinct types of repeating units of formula I

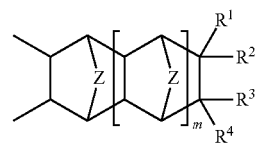

wherein Z is selected from $-CH_2-$, $-CH_2-CH_2-$ or $-O-$, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

The norbornene-type polymer and polymer composition embodiments of the present invention can advantageously be tailored to provide a distinct set of properties for each of many specific applications. That is to say that different combinations of norbornene-type monomers with several different types of pendant groups can be polymerized to provide norbornene-type polymers having properties that provide for obtaining control over properties such as flexibility, adhesion, dielectric constant, and solubility in organic solvents, among others. For example, varying the length of an alkyl pendant group can allow control of the polymer's modulus and glass transition temperature (Tg). Also, pendant groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

The first passivation layer comprises a polycycloolefinic polymer, preferably a norbornene type polymer, comprising one or more fluorinated pendant groups. Preferably said norbornene type polymer comprises one or more distinct types of repeating units of Formula I wherein one or more of $R^{1-4}$ are different from H, very preferably wherein only one of $R^{1-4}$ is different from H, and denote a fluorinated or perfluorinated aryl or aralkyl group.

The second passivation layer preferably comprises an organic fluoropolymer. Suitable fluoropolymers include, for example, highly soluble perfluoropolymers like those from the commercially available CYTOP™ series (Asahi Glass), Teflon AF® series (DuPont) or Hyflon AD® series (from Solvay). CYTOP polymers are described in "Modern Fluoroplastics", edited by John Scheris, John Wiley&Sons Ltd., 1997, Chapter: "Perfluoropolymers Obtained by Cyclopolymerisation" by N. Sugiyama, pages 541ff. Teflon AF is described in "Modern Fluoroplastics", edited by John Scheris, John Wiley&Sons Ltd., 1997, Chapter: "Teflon AF amorphous fluoropolymers" by P. R. Resnick, pages 397ff. Hyflon AD is described in "High Performance Perfluoropolymer Films and Membranes" V. Arcella et. al., Ann. N.Y. Acad. Sci. 984, pages 226-244 (2003). Very preferred fluoropolymers are Cytop® 809M, Cytop® 809SP or blends thereof. Further preferably the fluoropolymer is selected from fluoropolymers having a permittivity ∈ of 3.0 or less ("low k"), which is preferably in the range of from 1.3, very preferably from 1.7 to 3.0, most preferably from 2.0 to 2.6.

The third passivation layer comprises a polycycloolefinic polymer, preferably a norbornene type polymer, comprising one or more pendant fluorinated pendant groups and one or more pendant crosslinkable groups. Preferably said norbornene type polymer comprises one or more first, distinct types of repeating units of Formula I wherein one or more of $R^{1-4}$ are different from H, very preferably wherein only one of $R^{1-4}$ is different from H, and denote a fluorinated or perfluorinated aryl or aralkyl group. Further preferably said norbornene type polymer comprises one or more second, distinct types of repeating units of Formula I wherein one or more of $R^{1-4}$ are different from H, very preferably wherein only one of $R^{1-4}$ is different from H, and denote a crosslinkable group.

The fluorinated groups in the polymer of the first and/or third passivation layer are preferably selected from fluorinated or perfluorinated aryl or aralkyl groups including, but not limited to those of the formula $-(CH_2)_x-C_6F_yH_{5-y}$, and $-(CH_2)_x-C_6F_yH_{4-y}-pC_zF_qH_{2z+1-q}$, where x, y, q, and z are independently selected integers from 0 to 5, 0 to 5, 0 to 9, and 1 to 4, respectively, and "p" means "para". Specifically such formulae include, but are not limited to, trifluoromethyl, $-C_2F_5$, $-C_3F_7$, $-C_4F_9$, $C_6F_{13}$, $-C_7F_{15}$, $-C_{11}F_{23}$, pentafluorophenyl, pentafluorobenzyl, 4-trifluoromethylbenzyl, pentafluorophenylethyl, pentafluorophenpropyl, and pentafluorophenbutyl.

Further preferably the polymer of the first and/or third passivation layer comprise one or more repeating units of Formula I that are formed by one or more norbornene-type monomers selected from the group consisting of the following formulae:

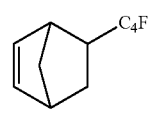

NBC4F9

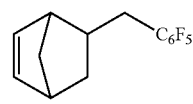

NBCH2C6F5

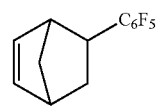

NBC6F5

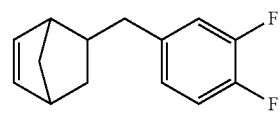

NBCH2C6H3F2

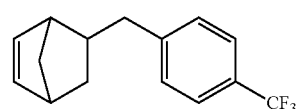

NBCH2C6H4CF3

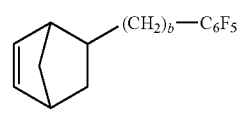

NBalkylC6F5

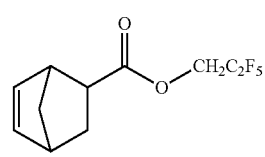

FPCNB

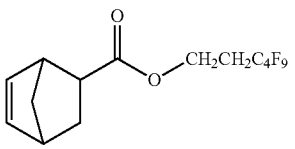

FHCNB

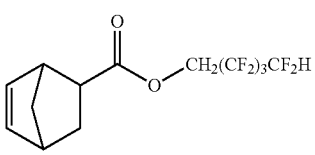

FOCHNB

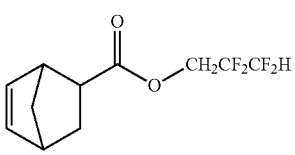

FPCHNB

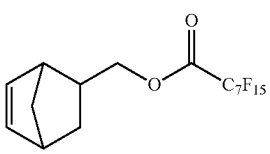

C₈PFAcNB

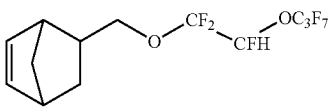

PPVENB where "C₆F₅" means pentafluorophenyl, in sub-formula 11 "PFAc" means —OC(O)—C₇F₁₅, and for each of the above subformulae having a methylene bridging group (a CH₂ covalently bonded to both the norbornene ring and a functional group) it will be understood that the methylene bridging group can be replaced by a covalent bond or a group —(CH₂)$_b$— as in formula 6, and b is an integer from 1 to 6.

Further preferably the polymers of the first and/or third passivation layer comprise one or more repeating units of Formula I where one of $R^{1-4}$, for example $R^1$, is a fluorinated or perfluorinated alkyl, aryl or aralkyl group as described above and the others of $R^{1-4}$ are H, and wherein $R^1$ is selected from one of the above subformulae 1-12 (NBC₄F₉, NBCH₂C₆F₅, NBC₆F₅, NBCH₂C₆H₃F₂, NBCH₂C₆H₄CF₃, NBalkylC₆F₅, FPCNB, FHCNB, FOCHNB, FPCHNB, C₈PFAcNB, PPVENB), and and more preferably from subformulae 2, 3, 14 5, 6 or 12 (NBCH₂C₆F₅, NBC₆F₅, NBCH₂C₆H₃F₂, NBCH₂C₆H₄CF₃, NBalkylC₆F₅ or PPVENB).

The pendant crosslinkable groups in the polymer of the third passsivation layer are preferably selected from photo-reactive or crosslinkable groups having have some degree of latency. By "latency", it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing such a pendant crosslinkable group, for example a substituted or unsubstituted maleimide or maleimide containing pendant group, to the polymerization reaction mixture and causing the polymerization thereof. Preferred crosslinkable groups include a group comprising a substituted or unsubstituted maleimide portion, an epoxide portion, a vinyl portion, an acetylene portion, an indenyl portion, a cinnamate portion or a coumarin portion, and more specifically a group selected from a 3-monoalkyl- or 3,4-dialkylmaleimide, epoxy, vinyl, acetylene, cinnamate, indenyl or coumarin group.

Preferably the polymer of the third passivation layer comprises one or more crosslinkable groups comprising a linking portion L and a functional portion F. Preferably L denotes or comprises a group selected from $C_1$-$C_{12}$ alkyls, aralkyls, aryls or hetero atom analogs. Preferably F denotes or comprises one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

As used herein, the terms "photoreactive" and "crosslinkable", when used to describe certain pendant groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

Further preferably the polymer of the third passivation layer comprises one or more repeating units of Formula I that are formed during polymerization from norbornene-type monomers selected from the groups consisting of the following formulae:

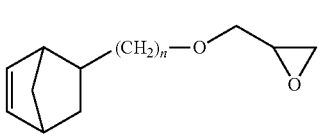

P1

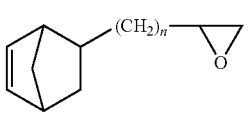

P2

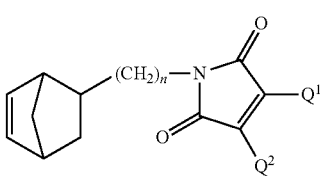

P3

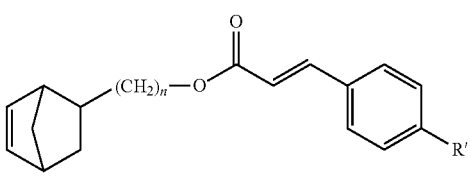

P4

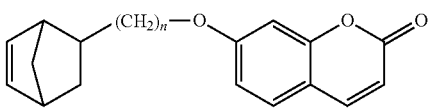

P5

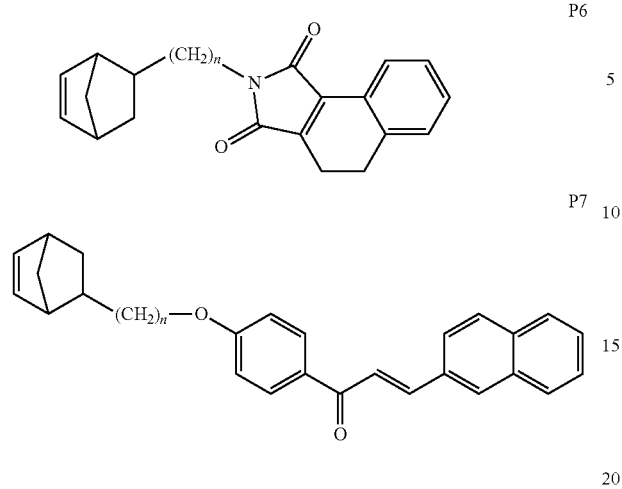
where n is an integer from 1 to 8, $Q^1$ and $Q^2$ are each independently from one another —H or —$CH_3$, and R' is —H or —$OCH_3$.
Further preferably the polymer of the third passivation layer comprises one or more repeating units of Formula I that are formed during polymerization from norbornene-type monomers selected from the group consisting of the following formulae:
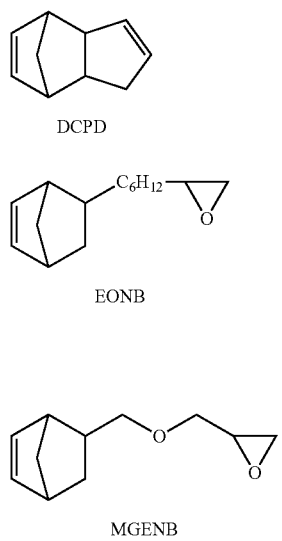
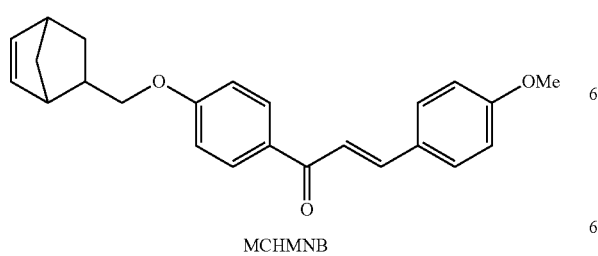

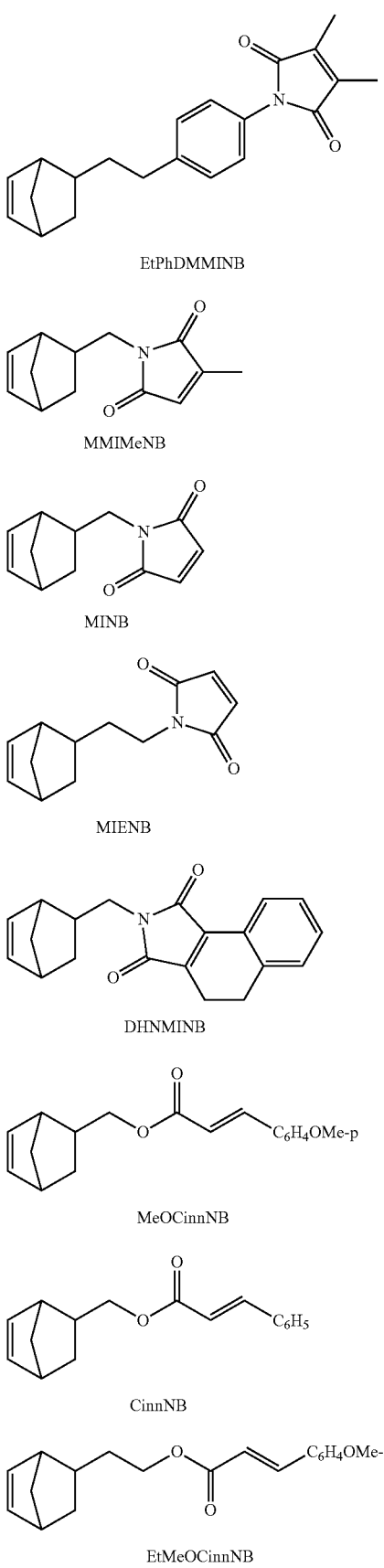
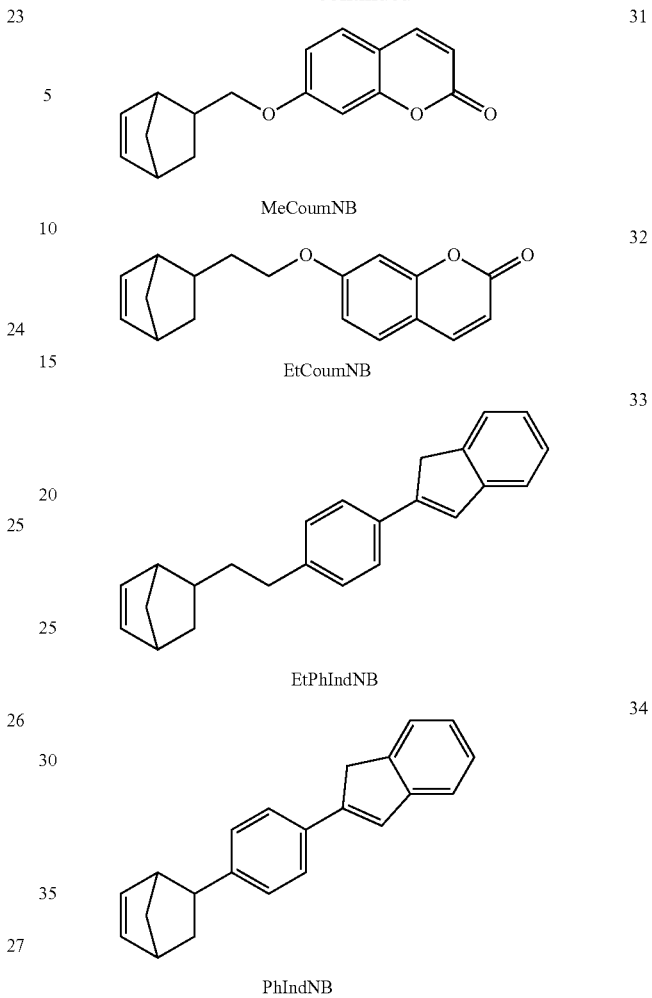

where "Me" means methyl, "Et" means ethyl, "OMe-p" means para-methoxy, "Ph" and "C₆H₅" mean phenyl, "C₆H₄" means phenylene, and for each of the above subformulae having a methylene bridging group (a $CH_2$ covalently bonded to both the norbornene ring and a functional group), it will be understood that the methylene bridging group can be replaced by a covalent bond or a group $-(CH_2)_b-$, and b is an integer from 1 to 6.

While Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that preferred embodiments of the present invention are made to take advantage of such differences by using monomers that are either a mixture of isomers that is rich in either the exo- or endo-isomer, or are essentially the pure advantageous isomer.

In another preferred embodiment the polymers of the third passivation layer comprise repeating units of Formula I where one of $R^{1-4}$, for example $R^1$, is a photoreactive or crosslinkable group as described above and the others of $R^{1-4}$ are H, and wherein $R^1$ is a group as shown in one of the above subformulae 13-34 and more preferably as shown in subformulae 18, 19, 20, 21 and 22 (DMMIMeNB, DMMIEtNB, DMMIPrNB, DMMIBuNB and DMMIHxNB).

In another preferred embodiment, the polymers of the third passivation layer comprise a first type of repeating unit selected from fluorinated repeating units as described above, and a second type of repeating unit selected from crosslinkable repeating units as described above, wherein the first type of repeating unit is selected from subformulae 1-12, more preferably 1, 2, 3, 4, 5, 6 and 12 (NBC$_4$F$_9$, NBCH$_2$C$_6$F$_5$, NBC$_6$F$_5$, NBCH$_2$C$_6$H$_3$F$_2$, NBCH$_2$C$_6$H$_4$CF$_3$, NBalkylC$_6$F$_5$, and PPVENB) and the second type of repeating unit is selected from subformulae 18, 19, 20, 21 and 2 (DMMIMeNB, DMMIEtNB, DMMIPrNB, DMMIBuNB and DMMIHxNB).

In the polymers having a first and a second distinct type of repeat units in accordance with Formula I, the ratio of such first and second type of repeat units is from 95:5 to 5:95. In another preferred embodiment the ratio of such first and second type of repeat units is from 80:20 to 20:80. In still another preferred embodiment the ratio of such first and second type of repeat units is from 60:40 to 40:60. In yet another preferred embodiment the ratio of such first and second type of repeat units is from 55:45 to 45:55.

Examples of suitable and preferred norbornene monomers, polymers and methods for their synthesis are provided herein and can also be found in U.S. Pat. Nos. 5,468,819, 6,538,087, US 2006/0020068 A1, US 2007/0066775 A1, US 2008/0194740 A1, PCT/EP2011/004281, U.S. Ser. No. 13/223,784, PCT/EP2011/004282 and U.S. Ser. No. 13/223,884, which are incorporated into this application by reference. Exemplary polymerization processes for norbornenes employ Group VIII transition metal catalysts and are described in the aforementioned US 2006/0020068 A1.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in a preferred embodiment, the polymer has a $M_w$ of at least 30,000, while in another preferred embodiment the polymer has a $M_w$ of at least 60,000. In another preferred embodiment, the upper limit of the polymer's $M_w$ is up to 400,000, while in another preferred embodiment the upper limit of the polymer's $M_w$ is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15000 mJ/cm$^2$. Suitable radiation sources include mercury, mercury/xenon, mercury/halogen and xenon lamps, argon or xenon laser sources, x-ray. Such exposure to actinic radiation is to cause crosslinking in exposed regions. Although other repeating unit pendant groups that crosslink can be provided, generally such crosslinking is provided by repeating units that encompass a maleimide pendant group, that is to say one of R$^1$ to R$^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

In another preferred embodiment, the crosslinkable polymer composition comprises a stabilizer material or moiety to prevent spontaneous crosslinking and improve shelf life of the polymer composition. Suitable stabilizers are antioxidants such as catechol or phenol derivatives that optionally contain one or more bulky alkyl groups, for example t-butyl groups, in ortho-position to the phenolic OH group.

In order to improve the processing of the individual device components, including functional layers and passivation layers, and the integrity of the electronic device, it is desirable to decrease the time needed for the process while keeping or improving the physical properties of the components being formed. This can be maintained where subsequent components and solvents used in forming such components are orthogonal and thus do not dissolve each other. Where such orthogonality is difficult to obtain, crosslinking, typically UV crosslinking, a first component to make such first component insoluble with respect to the polymer composition of a second component will prevent any influence of the properties of either component on the other component.

Shortening the time needed for the processing can be done for example by tuning the coating process, while decreasing the time needed for UV crosslinking can be achieved both by chemical adjustment of the polymer or by changes in the process. However, chemical modifications of polymers are limited, because the UV sensitivity is related to certain properties of the polymer, and for example changes towards increased UV sensitivity may decrease the solubility. Changing the process, for example by. using higher power UV, could increase the possibility of creating an ozone atmosphere and thus cause undesired changes in the surface of the polymer dielectric.

Therefore, in a preferred embodiment of the present invention the polymer used in the third passivation layer composition comprises one or more crosslinker additives. Such additives comprise two or more functional groups that are capable of reacting with the pendant crosslinkable groups of the polycycloolefinic polymer used to form the passivation layer. It will also be understood that the use of such crosslinker additives can also enhance the crosslinking of the aforementioned polymer.

Crosslinking by exposure to UV radiation is preferred.

The use of a crosslinker enhances the ability to pattern the passivation layer through the use of an imagewise exposure to an appropriate wavelength and dose of UV radiation.

The crosslinkable group of the crosslinker is preferably selected from a maleimide, a 3-monoalkyl-maleimide, a 3,4-dialkylmaleimide, an epoxy, a vinyl, an acetylene, an indenyl, a cinnamate or a coumarin group, or a group that comprises a substituted or unsubstituted maleimide portion, an epoxide portion, a vinyl portion, an acetylene portion, an indenyl portion, a cinnamate portion or a coumarin portion.

Very preferably the crosslinker is selected of formula II1 or II2

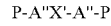   II1

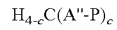   II2 wherein X' is O, S, NH or a single bond, A" is a single bond or a connecting, spacer or bridging group, which is selected from $(CZ_2)_n$, $(CH_2)_n$—$(CH=CH)_p$—$(CH_2)_n$, $(CH_2)_n$—O—$(CH_2)_n$, $(CH_2)_n$—$C_6Q_{10}$—$(CH_2)_n$, and C(O), where each n is independently an integer from 0 to 12, p is an integer from 1-6, Z is independently H or F, $C_6Q_{10}$ is cyclohexyl that is substituted with Q, Q is independently H, F, $CH_3$, $CF_3$, or $OCH_3$, P is a crosslinkable group, and c is 2, 3, or 4, and where in formula II1 at least one of X' and the two groups A″ is not a single bond.

P is preferably selected from a maleimide, a 3-monoalkyl-maleimide, a 3,4-dialkylmaleimide, an epoxy, a vinyl, an acetylene, an indenyl, a cinnamate or a coumarin group, or comprises a substituted or unsubstituted maleimide portion, an epoxide portion, a vinyl portion, an acetylene portion, an indenyl portion, a cinnamate portion or a coumarin portion.

Suitable and preferred compounds of formula II1 are selected from formula II1a:

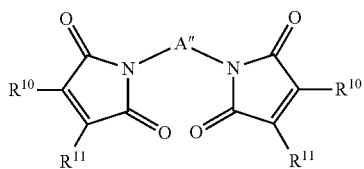

III1a wherein $R^{10}$ and $R^{11}$ are independently of each other H or a $C_1$-$C_6$ alkyl group, and A″ is as defined in formula II1. In one preferred embodiment of this invention, the crosslinkers are selected from DMMI-butyl-DMMI, DMMI-pentyl-DMMI and DMMI-hexyl-DMMI, wherein "DMMI" means 3,4-dimethylmaleimide.

The spacer group A″ preferably denotes linear $C_1$ to $C_{30}$ alkylene or branched $C_3$ to $C_{30}$ alkylene or cyclic $C_5$ to $C_{30}$ alkylene, each of which is unsubstituted or mono- or poly-substituted by F, Cl, Br, I or CN, wherein optionally one or more non-adjacent $CH_2$ groups are replaced, in each case independently from one another, by —O—, —S—, —NH—, —$NR^{18}$—, —$SiR^{18}R^{19}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, $R^{18}$ and $R^{19}$ are independently of each other H, methyl, ethyl or a $C_3$ to $C_{12}$ linear or branched alkyl group.

Preferred groups A″ are —$(CH_2)_r$—, —$(CH_2CH_2O)_s$—$CH_2CH_2$—, —$CH_2CH_2$—S—$CH_2CH_2$— or —$CH_2CH_2$—NH—$CH_2CH_2$— or —$(SiR^{18}R^{19}$—O$)_r$—, with r being an integer from 2 to 12, s being 1, 2 or 3 and $R^{18}$ and $R^{19}$ having the meanings given above.

Further preferred groups A″ are selected from methylene, ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene.

The synthesis of crosslinkers like those of formula II1a is disclosed for example in U.S. Pat. No. 3,622,321.

The passivation layers of the present invention can be used in a large variety of organic electronic OE devices, especially in OFETs and OLEDs, where they are typically located around the electrodes (in OFETs) or on the electrode (in OLEDs).

The passivation layers comprising polycycloolefinic polymers allow for time-, cost- and material-effective production of OE devices, especially OFETs and OLEDs, employing organic semiconductor (OSC) materials and organic dielectric materials on a large scale.

Further advantageously, the polycycloolefinic polymers used in the passivation layers in accordance with the present invention can be tailored to overcome the drawbacks that have been observed in previously known bank passivation layers, such as limited processability and limited solubility in organic solvents. Thus, the polycycloolefinic polymers show a good tunability of the polymers' properties like their solubility in organic solvents, allow a flexible material design that combines both hydrophobicity and UV sensitivity, and can be deposited by standard methods like ink-jet printing or flexo printing. The crosslinkable polycycloolefinic polymers of the third passivation layer are processable from unfluorinated, environmentally benign solvents, can be cross-linked by UV curing processes.

The passivation layers in accordance with the present invention can be provided by additive processing, for example by printing the passivation layers from a polymer solution using printing technologies like ink-jet printing, flexographic printing or gravure printing, followed by solvent removal and optionally curing the polymer for example by UV exposure.

The first and second layer are preferably deposited, for example by spin-coating or printing, from a fluorinated, very preferably from a perfluorinated solvent, like for example those of the Fluorinert™ series or those of the Novec™ series (commercially available from 3M™). Examples of suitable and preferred fluorinated or perfluorinated solvents include, without limitation, those selected from the group consisting of Fluorinert™ FC-43, Fluorinert™ FC-70, Fluorinert™ FC-75, Novec™ HFE-7500, Novec™ HFE-7500, Novec™ HFE-7200, Novec™ HFE-7300 and Novec™ HFE-7600, furthermore perfluorophenanthrene, perfluorodecalin, perfluoroperhydrofluorene, or mixtures or blends comprising one or more of the aforementioned solvents.

The third layer is preferably deposited, for example by spin-coating or printing, from a non-fluorinated organic solvent, like for example propylene glycol monomethyl ether acetate (PGMEA), cyclopentanone, ethyl acetate, methyl n-amyl ketone (MAK), methyl ethyl ketone (MEK), diethylene glycol butyl ether (DGBE) or xylene.

The third layer is then cross-linked for example by photoirradiation using 365 nm UV light with a dose of 1-2 J/cm².

Additionally, the third layer can be patterned by selective cross-linking, for example using a UV photo-mask. The pattern may then be developed for example using PGMEA.

Another preferred embodiment in accordance with the present invention relates to an organic electronic device comprising, or being obtained through the use of, a polycycloolefinic polymer or a polymer composition as described above and below. Such organic electronic devices include, among others, organic field effect transistors (OFETs), organic thin film transistors (OTFTs), which can be top gate or bottom gate transistors, Organic Light Emitting Diodes (OLED) or Organic Photovoltaic (OPV) Devices. For example, a bottom gate transistor in accordance with the present invention is depicted schematically in FIG. 1.

Turning now to FIG. 1, a schematic and simplified representation of a bottom gate OFET device in accordance with a preferred embodiment of the present invention is provided. Such OFET device includes a substrate (1), a gate electrode (2), a dielectric layer (3) serving as gate insulator, source and drain electrodes (4a, 4b), an OSC layer (5) provided on the source and drain electrodes (4a,b), and a passivation layer stack comprising a first (6*a*), second (6*b*) and third (6*c*) passivation layer as described above and below.

Another embodiment of the present invention relates to a process for preparing an OFET device, for example as illustrated in FIG. 1, by a) forming gate electrode (2) on a substrate (1), b) depositing a layer of dielectric material (3) on the gate electrode (2), c) forming source and drain electrodes (4*a,b*) on the dielectric layer (3), d) depositing a layer of organic semiconductor material (OSC) (5) on the dielectric layer (3) and the source and drain electrodes (4*a,b*), e) depositing a first passivation layer (6*a*) comprising a polycycloolefinic polymer comprising pendant fluorinated groups on the OSC layer (5), f) depositing a second passivation layer (6*b*) comprising a fluoropolymer on the first passivation layer (6*a*), g) depositing a third passivation layer (6*c*) comprising pendant fluorinated groups and pendant crosslinkable groups on the second passivation layer (6*b*), crosslinking the pendant crosslinkable groups, and optionally patterning the third layer (6*c*).

The electrodes (2, 4*a,b*) are for example applied onto the substrate or the dielectric layer (3) by a sputtering process, and can be patterned by etching and/or lithographic patterning. The OSC layer (5) and dielectric layer (3) can be applied by a coating or printing process. The first, second and third passivation layers (6*a,b,c*) can be applied by solution processing, for example by a coating or printing process, followed by drying, and in case of the third layer crosslinking.

In preferred embodiments in accordance with the present invention, deposition and/or forming of the layers and structures of the FET and OFET are performed using solution processing techniques where such techniques are possible. For example a formulation or composition of a material, typically a solution encompassing one or more organic solvents, can be deposited or formed using preferred techniques that include, but are not limited to, dip coating, slot-die coating spin coating, ink jet printing, letter-press printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an organic semiconductor material, a bank structure material and an organic dielectric material can each be deposited or formed by spin coating, flexographic printing, and inkjet printing techniques in an order appropriate to the device being formed.

In a preferred embodiment in accordance with the present invention the first, second and third passivation layers are prepared from a polymer composition comprising, in addition to one or more polycycloolefinic polymers or fluoropolymers, respectively, a casting or printing solvent, and optionally one or more additives selected from crosslinking agents, adhesion promoters, reactive solvents, stabilizers, UV sensitizers, and thermal sensitizers. Preferably, the concentration of the polymer material in the solvent is from 1 to 30 wt. %, although other concentrations can also be appropriate.

OFET embodiments in accordance with the present invention preferably employ a gate dielectric layer (3) that consists of a dielectric material ("gate dielectric") having a permittivity ($\in$ of 3.0 or less ("low k dielectric"), as disclosed in WO 03/052841. In some preferred embodiments $\in$ is in the range of from 1.3, preferably from 1.7, to 3.0 has been found to be appropriate while in other preferred embodiments a range from 2.0 to 3.0 is appropriate. In still other preferred OFET embodiments in accordance with the present invention a permittivity range of from 2.5 to 3.0 or from 2.0 to 2.6 has been found to be appropriate.

The other components or functional layers of the electronic device, like the substrate and the gate, source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

Generally the thickness of a functional layer, for example a gate dielectric or semiconductor layer, in some preferred electronic device embodiments according to the present invention is from 0.001 (in case of a monolayer) to 10 μm; In other preferred embodiments such thickness ranges from 0.001 to 1 μm, and in still other preferred embodiments from 5 nm to 500 nm, although other thicknesses or ranges of thickness are contemplated and thus are within the scope of the present invention.

Various substrates may be used for the fabrication of the electronic device embodiments of the present invention. For example glass or polymeric materials are most often used. Preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some embodiments of the present invention the substrate can be any suitable material, for example plastic, metal or glass material coated with one or more of the above listed materials. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein.

The gate, source and drain electrodes of the OFET device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3,4-ethylenedioxythiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors may also be used and deposited from a liquid phase.

The organic semiconductor (OSC) layer can be an n- or p-type OSC, which can be deposited by PVD, CVD or solution deposition methods. Effective OSCs exhibit a FET mobility of greater than $1 \times 10^{-5}$ $cm^2V^{-1}s^{-1}$.

OSC embodiments in accordance with the present invention can be either OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printg or gravure printing, are typically employed to allow for ambient temperature processing. However, OSCs can be deposited by any liquid coating technique, for example ink-jet deposition or via PVD or CVD techniques.

For some preferred OFET embodiments, the semiconducting layer that is formed can be a composite of two or more of the same or different types of semiconductors. For example, a p-type OSC material may, for example, be mixed with an n-type material to achieve a doping effect of the layer. In some preferred embodiments of the invention, multilayer semiconductor layers are used. For example an intrinsic semiconductor layer can be deposited near the gate dielectric interface and a highly doped region can additionally be coated adjacent such an intrinsic layer.

The OSC material employed for electronic device embodiments in accordance with the present invention can be any conjugated molecule, for example an aromatic molecule containing preferably two or more, very preferably at least three aromatic rings. In some preferred embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material may be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings may be optionally substituted with alkyl, alkoxy, polyalkoxy, thioalkyl, acyl, aryl or substituted aryl groups, halogen, where fluorine, cyano, nitro or an optionally substituted secondary or tertiary alkylamine or arylamine represented by —N($R^{15}$)($R^{16}$), where $R^{15}$ and $R^{16}$ are each independently H, an optionally substituted alkyl or an optionally substituted aryl, alkoxy or polyalkoxy groups are typically employed. Further, where $R^{15}$ and $R^{16}$ is alkyl or aryl these may be optionally fluorinated.

The aforementioned aromatic rings can be fused rings or linked with a conjugated linking group such as —C($T_1$)=C($T_2$)—, —C≡C—, ⁻N(R''')—, —N=N—, (R''')=N—, —N=C(R''')—, where $T_1$ and $T_2$ each independently represent H, Cl, F, —C≡N or lower alkyl groups such as $C_{1-4}$ alkyl groups; R''' represents H, optionally substituted alkyl or optionally substituted aryl. Further, where R''' is alkyl or aryl it can be fluorinated.

In some preferred OE device embodiments of the present invention, OSC materials that can be used include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(-substituted selenophene), polybenzothiophene, polyisothianapthene, poly(N-substituted pyrrole), poly(-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Further, in some preferred embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further preferred p-type OSCs are copolymers comprising electron acceptor and electron donor units. Preferred copolymers of this preferred embodiment are for example copolymers comprising one or more benzo[1,2-b:4,5-b'] dithiophene-2,5-diyl units that are preferably 4,8-disubstituted by one or more groups R as defined above, and further comprising one or more aryl or heteroaryl units selected from Group A and Group B, preferably comprising at least one unit of Group A and at least one unit of Group B, wherein Group A consists of aryl or heteroaryl groups having electron donor properties and Group B consists of aryl or heteroaryl groups having electron acceptor properties, and preferably Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5- diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, and 2,7-di-thien-2-yl-phenanthro[1,10,9,8-c,d,e,f,g] carbazole, all of which are optionally substituted by one or more, preferably one or two groups R as defined above, and Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxy-benzo[2,1,3]oxadiazole-4,7-diyl, 2H-benzotriazole-4,7-diyl, 2,3-dicyano-1,4-phenylene, 2,5-dicyano,1,4-phenylene, 2,3-difluro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, and 3,6-pyrrolo[3,4-c]pyrrole-1,4-dione, all of which are optionally substituted by one or more, preferably one or two groups R as defined above.

In other preferred embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Where appropriate and needed to adjust the rheological properties as described for example in WO 2005/055248 A1, some embodiments of the present invention employ OSC compositions that include one or more organic binders.

The binder, which is typically a polymer, may comprise either an insulating binder or a semiconducting binder, or mixtures thereof may be referred to herein as the organic binder, the polymeric binder, or simply the binder.

Preferred binders according to the present invention are materials of low permittivity, that is, those having a permittivity $\in$ of 3.3 or less. The organic binder preferably has a permittivity $\in$ of 3.0 or less, more preferably 2.9 or less. Preferably the organic binder has a permittivity $\in$ at of 1.7 or more. It is especially preferred that the permittivity of the binder is in the range from 2.0 to 2.9. Whilst not wishing to be bound by any particular theory it is believed that the use of binders with a permittivity $\in$ of greater than 3.3, may lead to a reduction in the OSC layer mobility in an electronic device, for example an OFET. In addition, high permittivity binders could also result in increased current hysteresis of the device, which is undesirable.

Examples of a suitable organic binders include polystyrene, or polymers or copolymers of styrene and α-methyl styrene, or copolymers including styrene, α-methylstyrene and butadiene may suitably be used. Further examples of suitable binders are disclosed for example in US 2007/0102696 A1.

In one type of preferred embodiment, the organic binder is one in which at least 95%, more preferably at least 98% and especially all of the atoms consist of hydrogen, fluorine and carbon atoms.

The binder is preferably capable of forming a film, more preferably a flexible film.

The binder can also be selected from crosslinkable binders such as acrylates, epoxies, vinylethers, and thiolenes, preferably having a sufficiently low permittivity, very preferably of 3.3 or less. The binder can also be mesogenic or liquid crystalline.

In another preferred embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula I in the binder has been found to have little or no detrimental effect on the charge mobility, in contrast to what would have been expected from the prior art.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Above and below, unless stated otherwise percentages are per cent by weight and temperatures are given in degrees Celsius (° C.). The values of the dielectric constant $\in$ ("permittivity") refer to values taken at 20° C. and 1,000 Hz.

Example 1

Bottom-gate OFETs were prepared using the following process:

1 inch glass substrates were cleaned using methanol in an ultrasonic bath. 40 nm silver gate electrodes were patterned by evaporation through a shadow mask. A 1 micron layer of dielectric Lisicon ® D207 (available from Merck Chemicals) was spin coated on top of the electrodes and cross-linked under 365 nm UV at a dose of 2.6 J/cm². 40 nm silver source and drain electrodes were then deposited by shadow-mask evaporation. The electrodes were treated with Lisicon ® M001 SAM (available from Merck Chemicals) by spin coating from isopropyl alcohol.

An OSC formulation consisting of a 4:1 ratio of FADT to poly-α-methyl-styrene at 2 wt % total solidsrpm and annealed for 1 minute at 100° C.

The transfer characteristics were obtained before coating with the three-layer passivation.

Layer (1) comprising the polymer pC4F9-norbornene ($M_w$ 150,000) was spin coated at 1,000 rpm from a 7 wt % solution in HFE7500 and annealed at 100° C. for 2 minutes, giving a layer thickness of ~800 nm.

Layer (2) comprising the polymer Cytop-CTL809M ® (Asahi Glass) was spin coated at 800 rpm from a 2.25 wt % solution in FC43 and annealed for 2 minutes at 100° C., giving a layer thickness of ~100 nm.

Layer (3) comprising the co-polymer pBuDMMI-norbornene:C4F9-norbornene 65:35 ($M_w$ 104,000) was spin coated at 1,000 rpm from a 12 wt % solution in PGMEA and annealed for 2 minutes at 100 C to give a layer thickness of ~1,000 nm. Layer (3) was then cross-linked at 365 nm with a dose of 1.3 J/cm$^2$.

The transfer measurement was repeated after passivation.

Figure 2A:
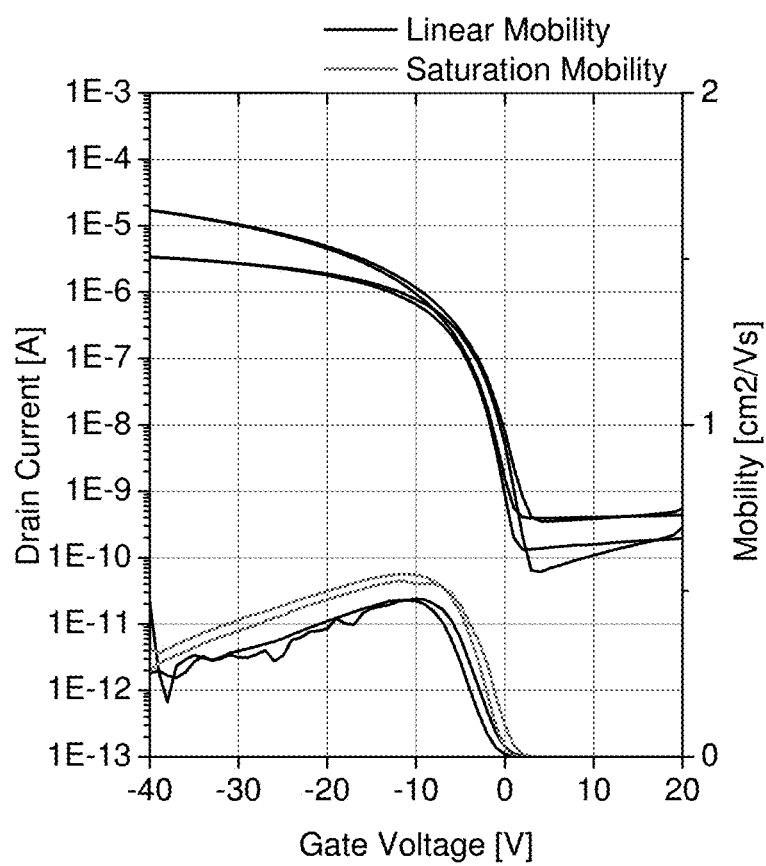
FIG. 2A—is a transfer curve of bottom gate OFET device of Example 1.
Figure 2B:
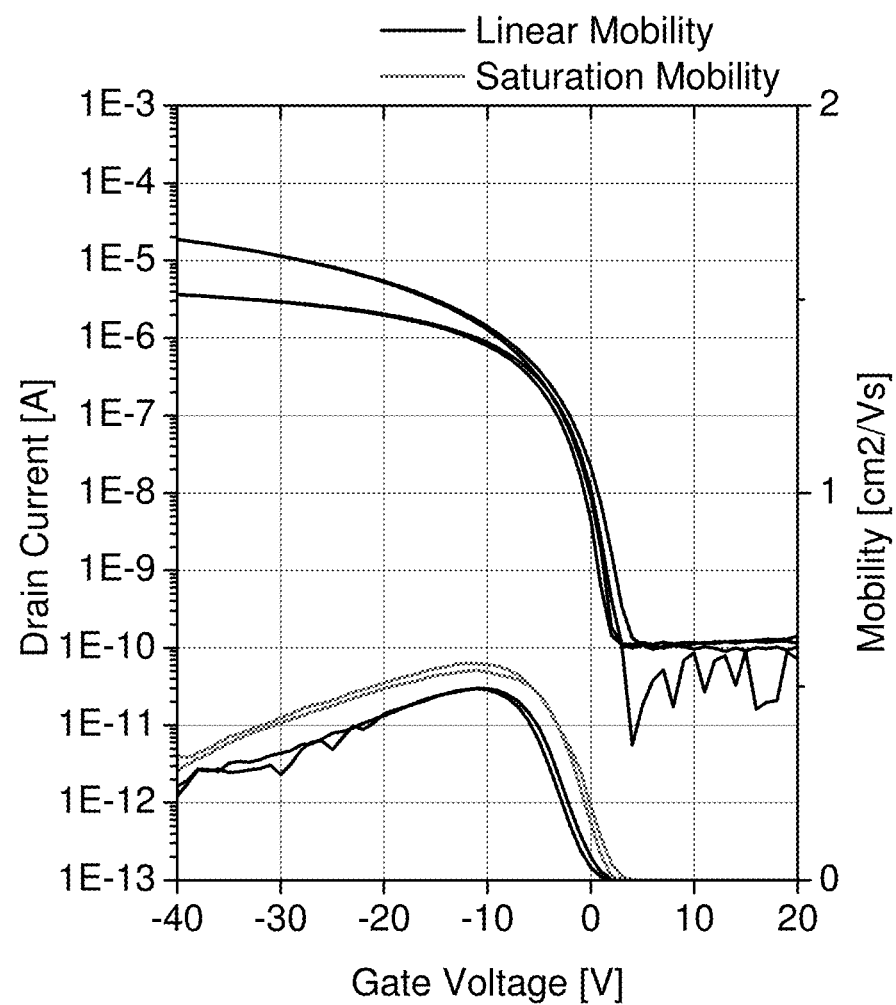
FIG. 2B—is a transfer curve of bottom gate OFET device of Example 1.

The transfer characteristics before passivation and after passivation are shown in FIG. 2a (before) and FIG. 2b (after). It can be seen that the mobility and on-current (0.5 cm$^2$/Vs and 3.5×10$^{-6}$ A respectively, in the linear regime) remain unchanged by the application of the passivation layers. This is also true for the saturation regime and for other key device parameters, such as the subthreshold slope and off-current.

Example 2

Figure 3A:
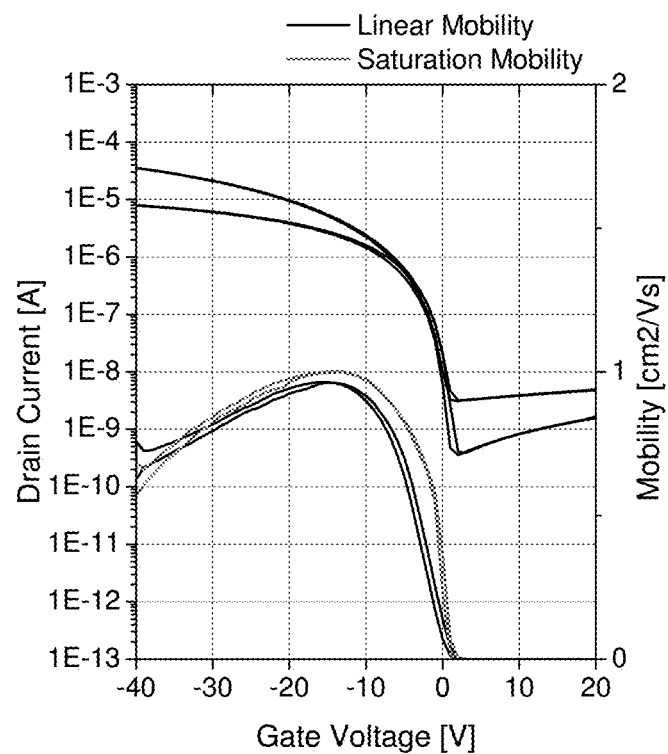
FIG. 3A—is a transfer curve of bottom gate OFET device of Example 2.

Bottom gate OFETs were prepared following the same procedure outlined in Example 1. Except that in this case Layer (3) was patterned by selective cross-linking by 365 nm UV through a shadow mask. Layer (3) was then developed using PGMEA. The transfer scan produced is shown in FIG. 3a.

Figure 3B:
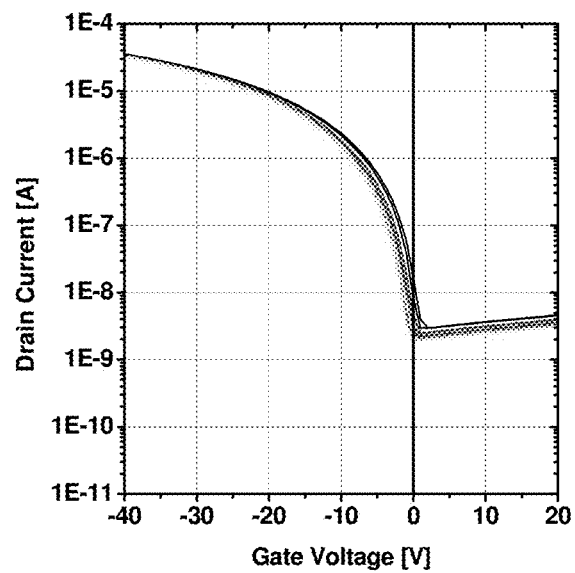
FIG. 3B—is another transfer curve of bottom gate OFET device of Example 2.

The devices were also found to be stable under bias-stress with a gate voltage of −30 V for 60 minutes (measured every 10 minutes) as shown in the transfer scan depicted in FIG. 3b. It can be seen that during the stress measurement, the device exhibits a threshold voltage shift of only −2.2 V, with a corresponding drop in the on-current at $V_G$=−40 V of only 6%. These changes in device performance are comparable to those for un-passivated devices indicating that the passivation layers have not caused any significant reduction in device stability.

The invention claimed is:

1. An organic electronic device comprising an organic semiconductor (OSC) layer and passivation layer stack provided on the OSC layer, characterized in that the passivation layer stack comprises
   a first layer that is deposited on the OSC layer and comprises a polycycloolefinic polymer comprising pendant fluorinated groups, and
   a second layer that is deposited on the first layer and comprises a fluoropolymer, and
   a third layer that is deposited on the second layer and comprises a polycycloolefinic polymer comprising pendant fluorinated groups and pendant crosslinkable groups.

2. The organic electronic device according to claim 1, wherein the polycycloolefinic polymer comprised in the first and the third layer is a norbornene-type polymer.

3. The organic electronic device according to claim 1, wherein the polycycloolefinic polymer comprised in the first and the third layer comprises one or more distinct types of repeating units of formula I

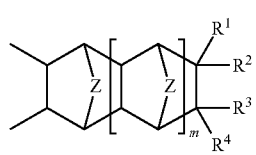

(I)

wherein Z is selected from —CH$_2$—, —CH$_2$—CH$_2$— or —O—, m is an integer from 0 to 5, each of R$^1$, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group.

4. The organic electronic device according to claim 3, wherein the polycycloolefinic polymer comprises one or more distinct types of repeating units of formula I comprising a pendant fluorinated or perfluorinated aryl or aralkyl group of the formula —(CH$_2$)$_x$—C$_6$F$_y$H$_{5-y}$, and —(CH$_2$)$_x$—C$_6$F$_y$H$_{4-y}$-pC$_z$F$_q$H$_{2z+1-q}$, where x, y, q, and z are independently selected integers from 0 to 5, 0 to 5, 0 to 9, and 1 to 4, respectively, and "p" means "para".

5. The organic electronic device according to claim 3, wherein the polycycloolefinic polymer comprises one or more distinct types of repeating units of formula I that are formed by one or more norbornene-type monomers selected from the group consisting of the following formulae:

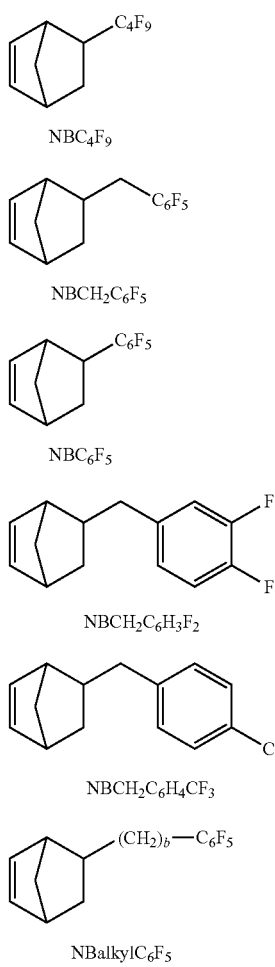
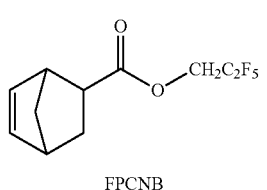

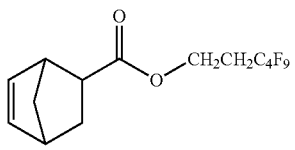

FHCNB  8

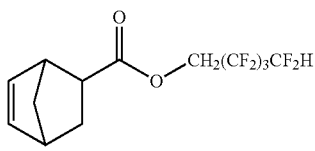

FOCHNB  9

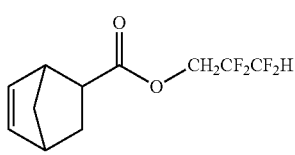

FPCHNB  10

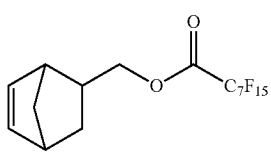

C₈PFAcNB  11

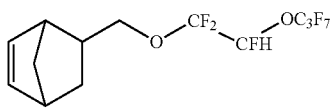

PPVENB  12 where "C₆F₅" means pentafluorophenyl, in sub-formula 11 "PFAc" means —OC(O)—C₇F₁₅, and for each of the above subformulae having a methylene bridging group (a CH₂ covalently bonded to both the norbornene ring and a functional group) it will be understood that the methylene bridging group can be replaced by a covalent bond or a group —(CH₂)$_b$— as in formula 6, and b is an integer from 1 to 6.

6. The organic electronic device according to claim 1, wherein the polycycloolefinic polymer comprised in the third layer comprises a photoreactive or crosslinkable group comprising a linking portion L and a functional portion F, wherein L denotes or comprises a group selected from C₁-C₁₂ alkyls, aralkyls, aryls or hetero atom analogs, and F denotes or comprises one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

7. The organic electronic device according to claim 3, wherein the polycycloolefinic polymer comprised in the third layer comprises one or more distinct types of repeating units of formula I that are formed during polymerization from norbornene-type monomers selected from the following formulae:

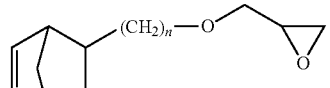

P1

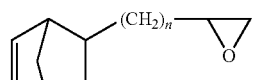

P2

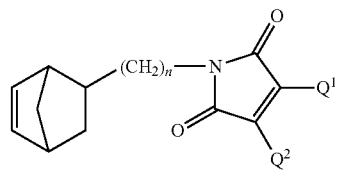

P3

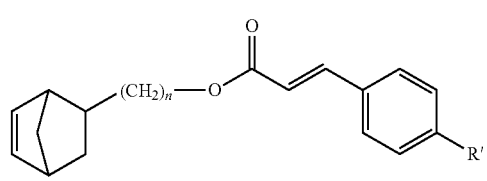

P4

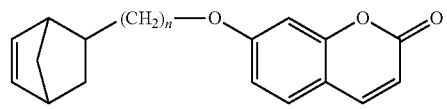

P5

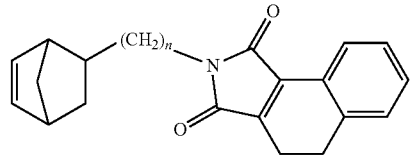

P6

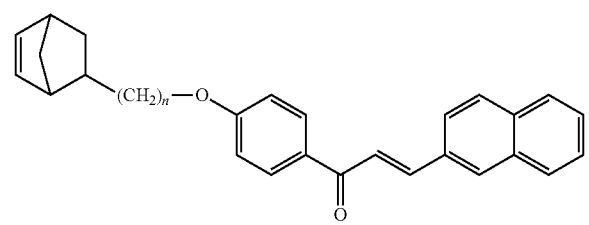

P7 where n is an integer from 1 to 8, Q¹ and Q² are each independently from one another —H or —CH₃, and R' is —H or —OCH₃.

8. The organic electronic device according to claim 3, wherein the polycycloolefinic polymer comprised in the third layer comprises one or more distinct types of repeating units of formula I that are formed during polymerization from norbornene-type monomers selected from the following formulae:

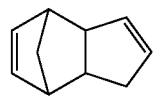

DCPD  13

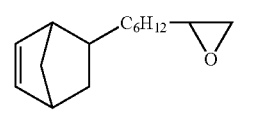
EONB
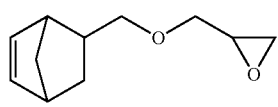
MGENB
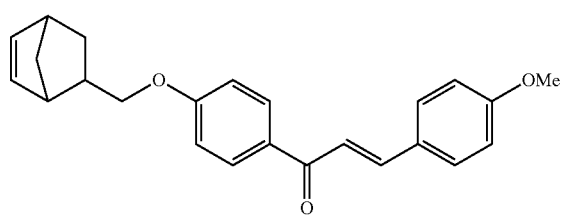
MCHMNB
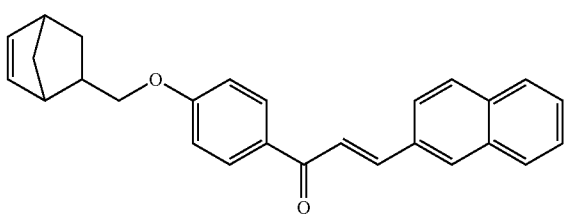
NPCHMNB
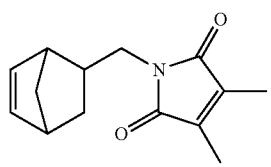
DMMIMeNB
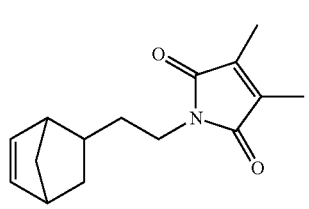
DMMIEtNB
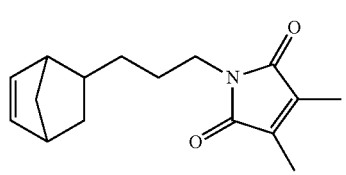
DMMIPrNB
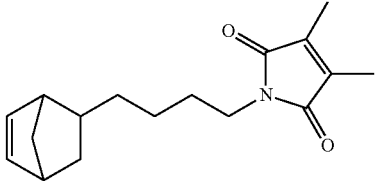
DMMIBuNB
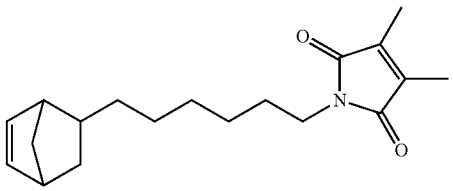
DMMIHxNB
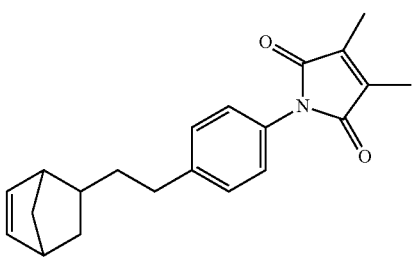
EtPhDMMINB
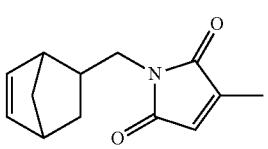
MMIMeNB
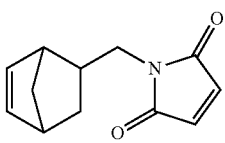
MINB
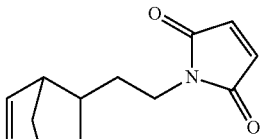
MIENB
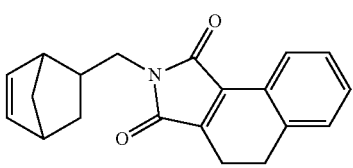
DHNMINB -continued

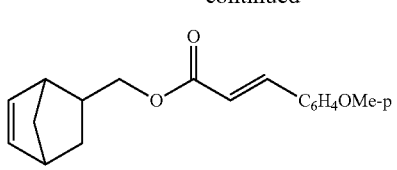

MeOCinnNB

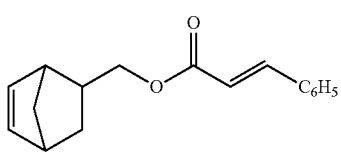

CinnNB

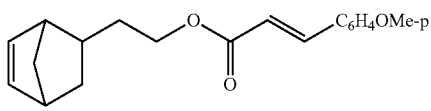

EtMeOCinnNB

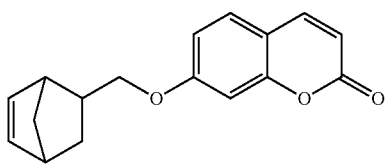

MeCoumNB

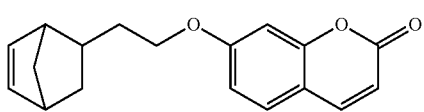

EtCoumNB

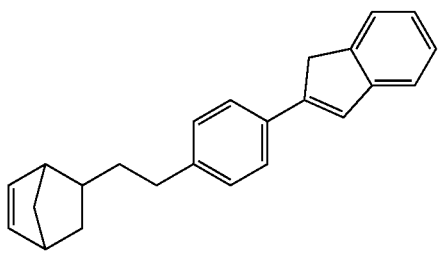

EtPhIndNB

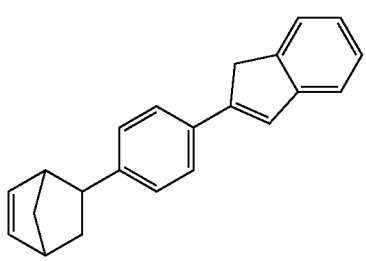

PhIndNB where "Me" means methyl, "Et" means ethyl, "OMe-p" means para-methoxy, "Ph" and "C$_6$H$_5$" mean phenyl, "C$_6$H$_4$" means phenylene, and for each of the above subformulae having a methylene bridging group (a CH$_2$ covalently bonded to both the norbornene ring and a functional group), it will be understood that the methylene bridging group can be replaced by a covalent bond or a group —(CH$_2$)$_b$—, and b is an integer from 1 to 6.

9. The organic electronic device according to claim 5, wherein the polycycloolefinic polymer comprised in the third layer comprises a first type of repeating unit selected from subformulae 1, 2, 3, 4, 5, 6 and 12 as defined in claim 5 (NBC$_4$F$_9$, NBCH$_2$C$_6$F$_5$, NBC$_6$F$_5$, NBCH$_2$C$_6$H$_3$F$_2$, NBCH$_2$C$_6$H$_4$CF$_3$, NBalkylC$_6$F$_5$, and PPVENB) and a second type of repeating unit selected from following subformulae 18, 19, 20, 21 and 22:

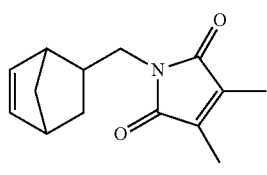

DMMIMeNB

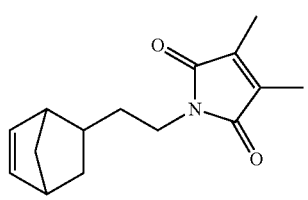

DMMIEtNB

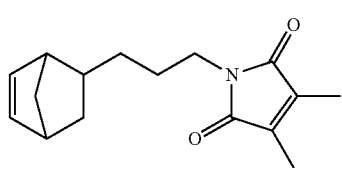

DMMIPrNB

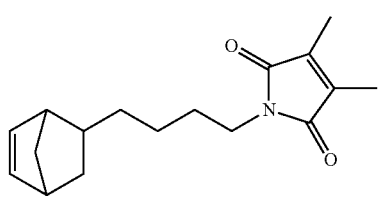

DMMIBuNB

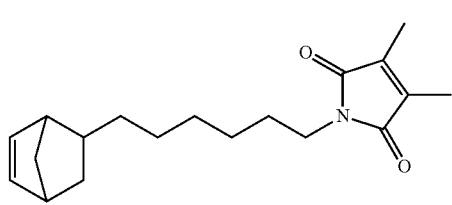

DMMIHxNB

10. The organic electronic device according to claim 1, wherein the second layer comprises an organic fluoropolymer.

11. The organic electronic device according to claim 10, wherein the fluoropolymer is selected from Cytop® 809M, Cytop® 809SP, or blends thereof.

12. The organic electronic device according to claim 1, wherein the first, second and third layer are derived from a polymer composition comprising, in addition to the polycycloolefinic polymer or fluoropolymer, one or more of a solvent, a crosslinking agent, an optional reactive solvent, a stabilizer, a UV sensitizer, an adhesion promoter, and a thermal sensitizer.

13. The organic electronic device according to claim 1, wherein the first layer is prepared from a polymer composition comprising a polycycloolefinic polymer and a fluorinated solvent.

14. The organic electronic device according to claim 1, wherein the second layer is prepared from a polymer composition comprising a fluoropolymer and a fluorinated solvent.

15. The organic electronic device according to claim 13, wherein the fluorinated solvent is selected from Fluorinert™ FC-43, Fluorinert™ FC-70, Fluorinert™ FC-75, Novec™ HFE-7500, Novec™ HFE-7500, Novec™ HFE-7200, Novec™ HFE-7300 and Novec™ HFE-7600, perfluorophenanthrene, perfluorodecalin, perfluoroperhydrofluorene, or mixtures of the aforementioned.

16. The organic electronic device according to claim 1, wherein the third layer is prepared from a polymer composition comprising a polycycloolefinic polymer and a non-fluorinated organic solvent.

17. The organic electronic device according to claim 16, wherein the non-fluorinated organic solvent is selected from propylene glycol monomethyl ether acetate (PGMEA), cyclopentanone, ethyl acetate, methyl n-amyl ketone (MAK), methyl ethyl ketone (MEK), diethylene glycol butyl ether (DGBE) or xylene.

18. The organic electronic device according to claim 1, which is an Organic Field Effect Transistor (OFET), Organic Thin Film Transistor (OTFT), Organic Light Emitting Diode (OLED), Organic Photovoltaic (OPV) device or Organic Photodetector (OPD).

19. The organic electronic device according to claim 18, which is a top gate OFET or bottom gate OFET.

20. The OFET according to claim 19, which comprises a substrate (1), a gate electrode (2), a dielectric layer (3) serving as gate insulator, source and drain electrodes (4a, 4b), the OSC layer (5) provided on the source and drain electrodes (4a,b), and the passivation layer stack comprising the first (6a), second (6b) and third (6c) layers of the passivation layer stack.

21. A process for preparing the OFET according to claim 20, which comprises the following steps:
 a) forming the gate electrode (2) on the substrate (1),
 b) depositing the dielectric layer (3) on the gate electrode (2),
 c) forming the source and drain electrodes (4a,b) on the dielectric layer (3),
 d) depositing the OSC layer (5) on the dielectric layer (3) and the source and drain electrodes (4a,b),
 e) depositing the first layer (6a) of the passivation layer stack on the OSC layer (5),
 f) depositing the second layer (6b) of the passivation layer stack on the first passivation layer (6a),
 g) depositing the third layer (6c) of the passivation layer stack on the second passivation layer (6b), crosslinking the pendant crosslinkable groups in the third layer (6c), and optionally patterning the third layer (6c).

22. A product or assembly comprising the organic electronic device according to claim 1, wherein the product or assembly is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a sensor, a biosensor or a biochip.

* * * * *